(12) United States Patent
Thompson et al.

(10) Patent No.: US 7,294,849 B2
(45) Date of Patent: Nov. 13, 2007

(54) MATERIALS AND DEVICES FOR BLUE PHOSPHORESCENCE BASED ORGANIC LIGHT EMITTING DIODES

(75) Inventors: Mark E. Thompson, Anaheim, CA (US); Stephen Forrest, Ann Arbor, MI (US)

(73) Assignees: The Trustees of Princeton University, Princeton, NJ (US); The University of Southern California, Los Angeles, CA (US)

(*) Notice: Subject to any disclaimer, the term of this patent is extended or adjusted under 35 U.S.C. 154(b) by 0 days.

(21) Appl. No.: 10/472,401

(22) PCT Filed: Mar. 13, 2002

(86) PCT No.: PCT/US02/07492

§ 371 (c)(1),
(2), (4) Date: Apr. 1, 2004

(87) PCT Pub. No.: WO02/074015

PCT Pub. Date: Sep. 19, 2002

(65) Prior Publication Data

US 2004/0155238 A1 Aug. 12, 2004

Related U.S. Application Data

(60) Provisional application No. 60/275,481, filed on Mar. 14, 2001.

(51) Int. Cl.
*H01L 35/24* (2006.01)
(52) U.S. Cl. ......... 257/40; 257/E51.001; 257/E51.008; 257/E51.018; 257/E51.019
(58) Field of Classification Search .......... 257/40, 257/642, 759, E39.007, E51.001, E51.008, 257/E51.018, E51.019; 438/99
See application file for complete search history.

(56) References Cited

U.S. PATENT DOCUMENTS 6,285,039 B1* 9/2001 Kobori et al. ............... 257/40

(Continued)

FOREIGN PATENT DOCUMENTS

DE 44 28 450 2/1996

(Continued)

OTHER PUBLICATIONS

Baldo, et al., "Highly Efficient Phosphorescent Emission from Organic Electroluminescent Devices", Nature, vol. 395, pp. 151-154, Sep. 1998.

(Continued)

*Primary Examiner*—Eugene Lee
(74) *Attorney, Agent, or Firm*—Kenyon & Kenyon LLP

(57) ABSTRACT

An OLED includes a wide gap inert host material doped with two dopants. One of the dopants is an emissive phosphorescent material that can transport either electrons or holes. The other dopant is a charge carrying material that can transport whichever of the electrons and holes that is not transported by the phosphorescent dopant. The materials are selected so that the lowest triplet energy level of the host material and the lowest triplet energy level of the charge carrying dopant material are each at a higher energy level than the lowest triplet state energy level of the phosphorescent dopant material. The device is capable, in particular, of efficiently emitting light in the blue region of the visible spectrum.

41 Claims, 5 Drawing Sheets

U.S. PATENT DOCUMENTS

| | | | |
|---|---|---|---|
| 6,361,886 B2 * | 3/2002 | Shi et al. | 428/690 |
| 6,365,270 B2 | 4/2002 | Forrest et al. | |
| 6,392,250 B1 * | 5/2002 | Aziz et al. | 257/40 |
| 6,495,274 B1 * | 12/2002 | Ishibashi et al. | 428/690 |
| 6,573,651 B2 * | 6/2003 | Adachi et al. | 313/504 |
| 6,579,630 B2 * | 6/2003 | Li et al. | 428/690 |
| 6,603,150 B2 * | 8/2003 | Liao et al. | 257/98 |
| 6,720,090 B2 * | 4/2004 | Young et al. | 428/690 |
| 6,784,016 B2 * | 8/2004 | Long et al. | 438/99 |
| 6,821,645 B2 * | 11/2004 | Igarashi et al. | 428/690 |
| 6,869,693 B2 * | 3/2005 | Fryd et al. | 428/690 |
| 2002/0028347 A1 | 3/2002 | Marrocco, III et al. | |
| 2002/0101154 A1 | 8/2002 | Seo et al. | |
| 2002/0113545 A1 | 8/2002 | Adachi et al. | |

FOREIGN PATENT DOCUMENTS

| | | |
|---|---|---|
| EP | 0 757 088 | 2/1997 |
| WO | WO 01/08230 | 2/2001 |
| WO | WO 01/41512 | 6/2001 |

OTHER PUBLICATIONS

D. F. O'Brien, et al., "Improved Energy transfer in electrophosphorescent devices", Appl. Phys. Lett., vol. 74, No. 3, pp. 442-444 (Jan. 18, 1999).

Baldo, et al., "Very High Efficiency Green Organic Light Emitting Devices based on Electrophosphorescence", Appl. Phys. Letter, vol. 75, No. 1, pp. 4-6 (Jul. 5, 1999).

T. Tsutsui, et al., "High Quantum Efficiency in Organic Light-Emitting Devices with Iridium-Complex as a Triplet Emissive Center", Japanese. J. Appl. Phys., Part 2, vol. 38, pp. L1502-L1504 (1999).

C. Adachi, et al., "High-efficiency organic electrophosphorescent devices with tris(2-phenylpyridine) iridium doped into electron-transporting materials", Appl. Phys. Lett., vol. 77, No. 6, pp. 904-906, (Aug. 7, 2000).

M. J. Yang, et al., "Use of poly(9-vinylcarbazole) as Host Material for Iridium Complexes in High-Efficiency Organic Light emitting devices", Japanese J. Appl. Phys., Part 2, vol. 39, pp. L828-L829 (2000).

C. L. Lee, et al., "Polymer phsophorescent light-emitting devices doped with tris(2-phenylpyridine) iridium as a triplet emitter", Appl. Phys. Lett., vol. 77, No. 15, pp. 2280-2282 (Oct. 9, 2000).

Lyons et al., 1998, Solid-State Light-Emitting Devices Based on the Trischelated Rithenium (ll) Complex 1 Thin Film Blends with Poly(ethylene oxide), J. Am. Chem. Soc. 120:12100-12107.

Supplementary European Search Report for European Patent Application No.: 02750605, mailed on Mar. 19, 2007.

* cited by examiner

MATERIALS AND DEVICES FOR BLUE PHOSPHORESCENCE BASED ORGANIC LIGHT EMITTING DIODES

REFERENCE TO RELATED APPLICATION

This application claims the benefit of U.S. Provisional Application No. 60/275,481 filed on Mar. 14, 2001.

RESEARCH AGREEMENTS

The claimed invention was made by, on behalf of, and/or in connection with one or more of the following parties to a joint university-corporation research agreement: Princeton University, The University of Southern California, and Universal Display Corporation. The agreement was in effect on and before the date the claimed invention was made, and the claimed invention was made as a result of activities undertaken within the scope of the agreement.

GOVERNMENT RIGHTS

This invention was made with Government support under Contract No. F33615-94-1-1414 awarded by DARPA and Contract No. DMR94-00362 awarded by the National Science Foundation. The government has certain rights in this invention.

FIELD OF THE INVENTION

The present invention relates to highly efficient organic light emitting devices (OLEDs) that are, for example, capable of emitting blue light, and in particular to OLEDs that have an emitting layer comprising a phosphorescent dopant material and a charge carrying dopant material that are doped in an inert host material.

BACKGROUND OF THE INVENTION

Organic light emitting devices (OLEDs), which make use of thin film materials that emit light when excited by electric current, are expected to become an increasingly popular form of flat panel display technology. This is because OLEDs have a wide variety of potential applications, including cell phones, personal digital assistants (PDAs), computer displays, informational displays in vehicles, television monitors, as well as light sources for general illumination. Due to their bright colors, wide viewing angle, compatibility with full motion video, broad temperature ranges, thin and conformable form factor, low power requirements and the potential for low cost manufacturing processes, OLEDs are seen as a future replacement technology for cathode ray tubes (CRTs) and liquid crystal displays (LCDs), which currently dominate the growing $40 billion annual electronic display market. Due to their high luminous efficiencies, electrophosphorescent OLEDs are seen as having the potential to replace incandescent, and perhaps even fluorescent, lamps for certain types of applications.

Successful utilization of phosphorescence holds enormous promise for organic electroluminescent devices. For example, an advantage of phosphorescence is that all excitons (formed by the recombination of holes and electrons in an EL), which are formed either as a singlet or triplet excited state, may participate in luminescence. This is because the lowest singlet excited state of an organic molecule is typically at a slightly higher energy than the lowest triplet excited state. This means that, for typical phosphorescent organometallic compounds, the lowest singlet excited state may rapidly decay to the lowest triplet excited state from which the phosphorescence is produced. In contrast, only a small percentage (about 25%) of excitons in fluorescent devices are believed to be capable of producing the fluorescent luminescence that is obtained from a singlet excited state. The remaining excitons in a fluorescent device, which are produced in the lowest triplet excited state of an organic molecule, are typically not capable of being converted into the energetically unfavorable higher singlet excited states from which the fluorescence is produced. This energy, thus, becomes lost to radiationless decay processes that only tend to heat-up the device.

As a consequence, since the discovery that phosphorescent materials can be used as the emissive material in highly efficient OLEDs, there is now much interest in finding still more efficient electrophosphorescent materials and OLED structures containing such materials.

High efficiency organic light emitting devices (OLEDs) using the phosphorescent dopant, fac tris(2-phenylpyridine) iridium ($Ir(ppy)_3$), have been demonstrated using several different conducting host materials. M. A. Baldo et al., Nature, vol. 395, 151 (1998); D. F. O'Brien et al., Appl. Phys. Lett., vol. 74, 442 (1999); M. A. Baldo et al., Appl. Phys. Lett., vol. 75, 4 (1999); T. Tsutsui et al., Japanese. J. Appl. Phys., Part 2, vol. 38, L1502 (1999); C. Adachi et al., Appl. Phys. Let., vol. 77, 904 (2000); M. J. Yang et al., Japanese J. Appl. Phys., Part 2, vol. 39, L828 (2000); and C. L. Lee et al., Appl. Phys. Left., vol. 77, 2280 (2000). Since the triplet level of the metal-ligand charge transfer state of the green-emitting $Ir(ppy)_3$ is between 2.5 eV and 3.0 eV, deep blue fluorophores with a peak wavelength at about 400 nm, such as 4,4'-N,N'-dicarbazole-biphenyl (CBP), are likely candidates as triplet energy transfer and exciton confining media. Using 6% to 10%-$Ir(ppy)_3$ in CBP leads to efficient $Ir(ppy)_3$ phosphorescence. In addition to the energetic resonance between the dopant and the host, the control of charge carrier injection and transport in the host layers is believed to be necessary for achieving efficient formation of radiative excitons. High electrophosphorescence efficiency has been achieved using $Ir(ppy)_3$ doped into CBP along with a 2,9-dimethyl-4,7-diphenyl-phenanthroline (BCP) electron transport and exciton blocking layer. M. A. Baldo et al., Appl. Phys. Lett., vol. 75, 4 (1999). In that device, the doped CBP layer was found to readily transport holes.

Current materials used in phosphorescent OLEDs may be used to form devices with internal quantum efficiencies of near 100%. However, the materials used to form the hole transporting, recombination and blocking layers in these conventional devices tend to have triplet energies corresponding to emission in the green part of the visible spectrum. If a dopant capable of producing blue phosphorescence is inserted in such a device utilizing the existing materials and structures, the emission will only come, if at all, inefficiently from the matrix material, and not from the phosphorescent dopant material. Accordingly, there is great interest in finding efficient OLED structures that can emit in the blue region of the visible electromagnetic spectrum.

SUMMARY OF THE INVENTION

The present invention relates to OLED devices that efficiently emit light, in particular that preferably emit light in the blue range of the visible spectrum, and to a method for forming such devices. The OLEDs made according to the invention preferably include blue phosphorescent OLEDs with efficiency levels comparable to those of current green to red phosphorescent OLEDs.

The present invention is directed to an OLED, and to methods of preparing the same, in which the emissive layer comprises a wide gap host material doped with both a charge carrying dopant material and a phosphorescent dopant material. The charge carrying dopant material is capable of transporting a hole or an electron, and the phosphorescent dopant material is capable of transporting a charge opposite to the charge carried by the charge carrying dopant material. Each dopant material, thus, carries charge, though of opposite polarity. The charge carrying phosphorescent material also performs the function of emitting the phosphorescent radiation. Thus, the term "charge carrying dopant material" is reserved herein to refer to the material that only carries charge, whereas the phosphorescent dopant material may be referred to, interchangeably herein, simply as the "phosphorescent dopant material" or, alternatively, as the "charge carrying phosphorescent dopant material".

For example, in one embodiment, the charge carrying dopant material is a hole transporting material and the phosphorescent dopant material is an electron transporting material. The phosphorescent dopant material is, in addition, the emissive material that produces phosphorescent radiation when a voltage is applied across the OLED. In another embodiment, the charge carrying dopant material is an electron transporting material and the phosphorescent dopant material is a hole transporting material, in addition to being the emissive material.

In each embodiment, the lowest triplet state energy level of the wide gap host material and the lowest triplet state energy level of the charge carrying dopant material are each higher than the lowest triplet state energy level of the phosphorescent dopant material. Preferably, the lowest triplet state energy level of the wide gap host material is also higher than the lowest triplet state energy level of the charge carrying dopant material. Typically, for those materials that are capable of producing phosphorescent radiation, such radiation is emitted almost exclusively only from the lowest triplet state energy level of that matertial.

The present invention is further directed to the emissive layer, and methods of preparing the same, comprising the wide gap host material with the charge carrying dopant material and the phosphorescent dopant material that are each dispersed in the host material, wherein the lowest triplet state energy level of the wide gap host material and the lowest triplet state energy level of the dopant material are each higher than the lowest triplet state energy level of the phosphorescent dopant material. In this embodiment, the lowest triplet state energy level of the wide gap host material is also preferably higher than the lowest triplet state energy level of the charge carrying dopant material.

The present invention is further directed to a method of selecting the materials that may be used in an efficient OLED, in particular, selecting materials having the combination of relative properties as prescribed herein.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the invention and are incorporated in an constituent part of this specification, Illustrate several embodiments of the invention and together with a description serve to explain the present invention. In the drawings.

DETAILED DESCRIPTION OF EMBODIMENTS OF THE INVENTION

Figure 1:
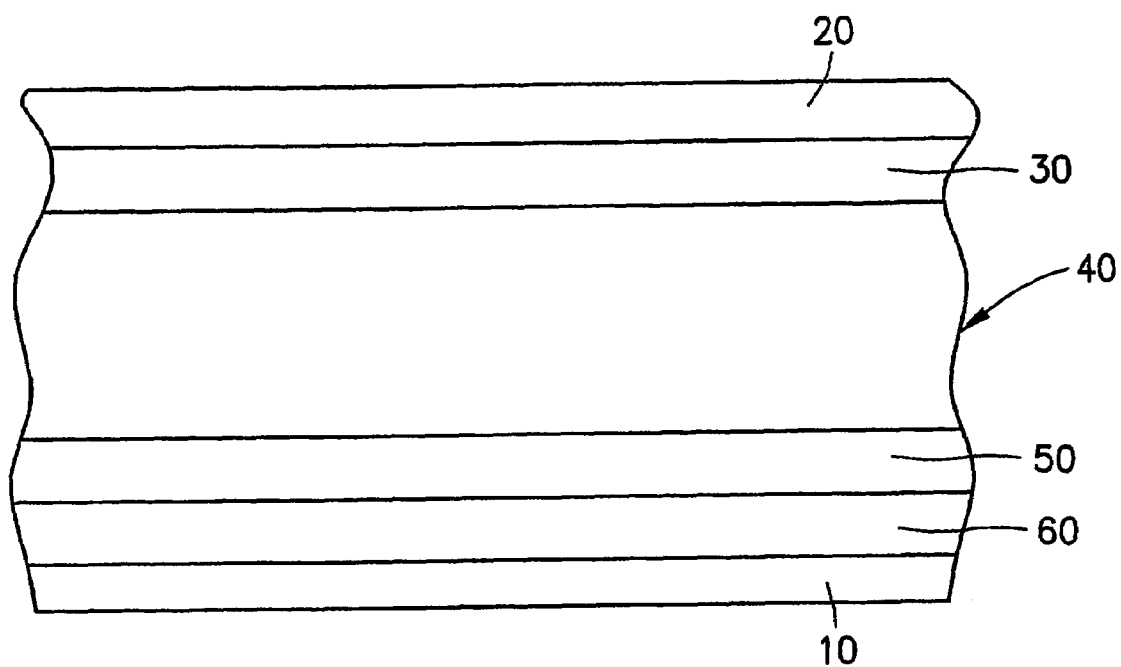
FIG. 1 shows a schematic cross section of an OLED structure according to the present invention.

Embodiments of the present invention will be described with reference to the drawings. It is understood that these embodiments are intended as illustrative examples of the invention, and do not limit the invention.

The OLEDs made according to the present invention include phosphorescent dopants dispersed in the device's emissive layer, preferably capable of achieving internal quantum efficiencies approaching 100%. The emissive dopants in these devices typically contain heavy transition metal atoms, such as, for example, iridium or platinum, that induce efficient radiative relaxation of triplet excitons. Although iridium and platinum have provided high quantum efficiencies, other heavy metals such as osmium or gold may also be used. These phosphorescent dopants thus can take advantage of substantially all the excitons available within the emissive layer of the device, resulting in much higher efficiencies compared to devices using only singlet excitation to induce luminescence.

The luminescent emission from OLEDs is typically via fluorescence or phosphorescence. As used herein, the term "phosphorescence" refers to emission from a triplet excited state of an organic molecule and the term "fluorescence" refers to emission from a singlet excited state of an organic molecule.

The mechanism that was originally believed to be responsible for electroluminescence from dye-doped OLEDs involved exciton formation in the host matrix followed by energy transfer from the host to the dopant via a Förster or Dexter energy transfer process. While this process is still also believed to occur in phosphorescence-based OLEDs, there is a second process that is believed to be important for helping to increase the efficiency of these electrophosphorescent devices. The HOMO energy levels of the phosphorescent dopants are typically higher in energy than those of the matrix materials into which they are doped. This means that the dopants are capable of trapping holes and transporting them through the matrix if the doping level is high enough. The end result is that the dopant itself may act as the site of hole-electron recombination. This means that a Förster and/or a Dexter-type host-dopant energy transfer process may be unnecessary in an inert, non-charge-carrying host material, if the exciton can be preferentially formed at the dopant site.

A trapping/recombination process of this type may be beneficially used for the formation of the blue phosphorescent OLEDs of the present invention, since such a process does not require generation of excitons in the host matrix that are higher in energy than the blue phosphors (i.e., at the very high energy levels in the violet to ultraviolet regions of the spectrum). A simple structure may be used in which the emissive region of the device is a wide gap host matrix, doped with a phosphorescent dopant that is capable of transporting holes and an electron transporter. Alternatively, the phosphor could carry electrons and the emissive layer would be co doped with a hole transporter. The present invention is directed toward OLEDs having such simple structures.

Thus, one of the distinctive features of the present invention is that the charge carrying materials that are typically used as the predominant component, if not sole component, for the hole transporting layer or the electron transporting layer in a conventional OLED, may be used in the present invention as the charge carrying dopant material in an inert matrix. An additional feature of the present invention is the use of an emissive material capable of carrying a charge opposite to the charge carried by the charge carrying dopant material, wherein the emissive material is dispersed in the host matrix together with the charge carrying dopant material.

It is believed that selection of such charge carrying emissive materials permits electron/hole recombination to take place directly on the emissive material in the inert matrix. Furthermore, by selecting such a combination of materials as prescribed herein, it is believed that the electroluminescent radiation may be more readily obtained from materials that have emissive triplet state energy levels at much higher energies than are typically available for producing electrophosphorescent radiation. Typically, in a prior art OLED, energy transfer that tends to take place from these high triplet state energy levels to lower triplet state energy levels that are present in the other OLED materials would be expected to substantially prevent any radiative emission from being obtained from the higher-energy triplet states. Thus, the electrophosphorescent devices of the present invention are preferably capable of producing radiation in the higher energy regions of the visible spectrum, in particular, in the blue region of the visible spectrum.

It is further believed that by using an inert host matrix in combination with the prescribed charge carrying dopant material and the prescribed charge carrying phosphorescent dopant material, such a combination of materials permits selection from a much wider range of OLED materials. This is in contrast to a typical OLED that may have, in sequence, a hole injecting layer, a hole transporting layer, an electron transporting layer, an electron injecting layer, and a phosphorescent dopant material that is present in either the hole transporting layer or the electron transporting layer. The electron transporting layer, or still another electron transporting layer, may be used simply to function as a hole or exciton blocking layer. The materials used in each of these layers must be selected in combination so as to limit the radiationless energy transfer pathways that tend to reduce device efficiency.

The present invention is directed to OLEDs that are capable of containing a significantly smaller number of materials that need to be matched so as to limit the radiationless loss pathways. Preferably, only three organic OLED materials need to be used in the preferred embodiments of the present invention, an inert host material, a charge carrying dopant material and a charge carrying phosphorescent dopant material. Furthermore, the emissive layer includes an inert host material having such a large energy gap between the HOMO and LUMO levels of the material that the inert host matrix does not participate in hole or electron transport, since the hole and electrons that are created in the OLED do not have sufficient energy to be transported respectively through the HOMO or LUMO levels of the host material. In addition, since these inert host materials have such a wide energy gap between the HOMO and LUMO levels, such materials may be readily selected to have a lowest triplet excited state level that is higher than the lowest triplet state level of the emissive phosphorescent material and, optionally, also higher than the lowest triplet state level of the charge carrying dopant material.

This means that by selecting charge carrying dopant materials based on the relative location of their emissive triplet state energy levels and, in addition, based on their effectiveness in carrying charge through the inert host matrix, it is believed that one skilled in the art may choose from a much wider range of OLED materials than is possible if the host material is capable of participating in hole or electron transport. Thus, both the inert host and the charge carrying dopant materials may be more readily selected, in combination, so as to limit the radiationless energy relaxation pathways that can cause a loss in device efficiency.

Similarly, by selecting a charge carrying emissive material having the prescribed relative triplet state energy level, it is believed that one skilled in the art may also choose from a much wider range of charge carrying emissive materials since there are far fewer additional materials present in the OLED that must be properly matched with the charge carrying emissive material. In this case, one can select those charge carrying emissive materials that permit energy transfer to be channeled through a limited number of energy relaxation pathways so as to achieve a high electrophosphorescent efficiency.

In one of the preferred embodiments of the invention, the emissive material may be selected so as to produce radiation with an emission peak in the higher-energy, blue region of the visible spectrum. This corresponds to a range from about 430 nm to about 470 nm, more preferably with an emission peak at about 450 nm. It is to be understood that the materials and methods of the present invention may also be employed to produce radiation in other lower-energy regions, for example, in the green or red regions of the visible spectrum, while still remaining within the spirit and scope of the present invention.

The preferred embodiments of the present invention are directed toward OLEDs containing a single, emissive, organic layer comprising only the host material doped with the charge carrying dopant material and the charge carrying phosphorescent dopant material, with one interface in direct contact with an anode and the opposite interface in direct contact with a cathode. However, the present invention also includes embodiments in which additional layers are present, for example, including a hole injecting layer, an electron injecting layer, and a hole blocking layer, and/or an exciton blocking layer. Thus, while it is preferred not to include these additional layers, it is believed that the single, emissive, organic layer may be used in combination with one or more of these additional layers.

An embodiment of an OLED structure according to the invention is described with reference to FIG. 1. The device can be manufactured, for example, by forming the various layers on a substrate 10 by vacuum deposition or by organic vapor phase deposition (OVPD). Vacuum deposition typically requires a high vacuum of between about 10 OE-11 to 10 E-5 torr. OVPD requires a weaker vacuum, for example of between about 10 E-5 to 50 torr. Other manufacturing techniques may also be used to form the device. For example, polymeric layers may be formed by spin coating.

A substrate 10 is first formed, on which an anode layer 60 connected to a positive power supply is formed. Adjacent to anode layer 60 a hole injecting layer 50 may optionally be formed. For example, hole injecting layer 50 can be a coating formed on anode 60. A wide gap host material layer 40 is formed above the optional hole injecting layer 50, using conventional manufacturing methods. The wide gap host material layer 40 thus defines the emissive region of the OLED, which comprises a doped layer containing the charge carrying dopant material and the phosphorescent dopant material. An electron injecting layer 30 may optionally be formed next, and is followed by a conventional cathode layer 20 connected to a negative power supply. One or both of anode layer 60 and cathode layer 20 can be transparent to the electromagnetic radiation emitted by the device.

In one embodiment, the wide gap host material layer 40, also referred to as matrix material, has triplet state energy levels that are well above the energy levels of all the dopants used in the device. Wide gap host material layer 40 is preferably inert, that is, it preferably does not carry a charge within the structure of the OLED. Accordingly, charge is preferably carried only by the dopants, and not by the wide gap host material layer 40.

Figure 2:
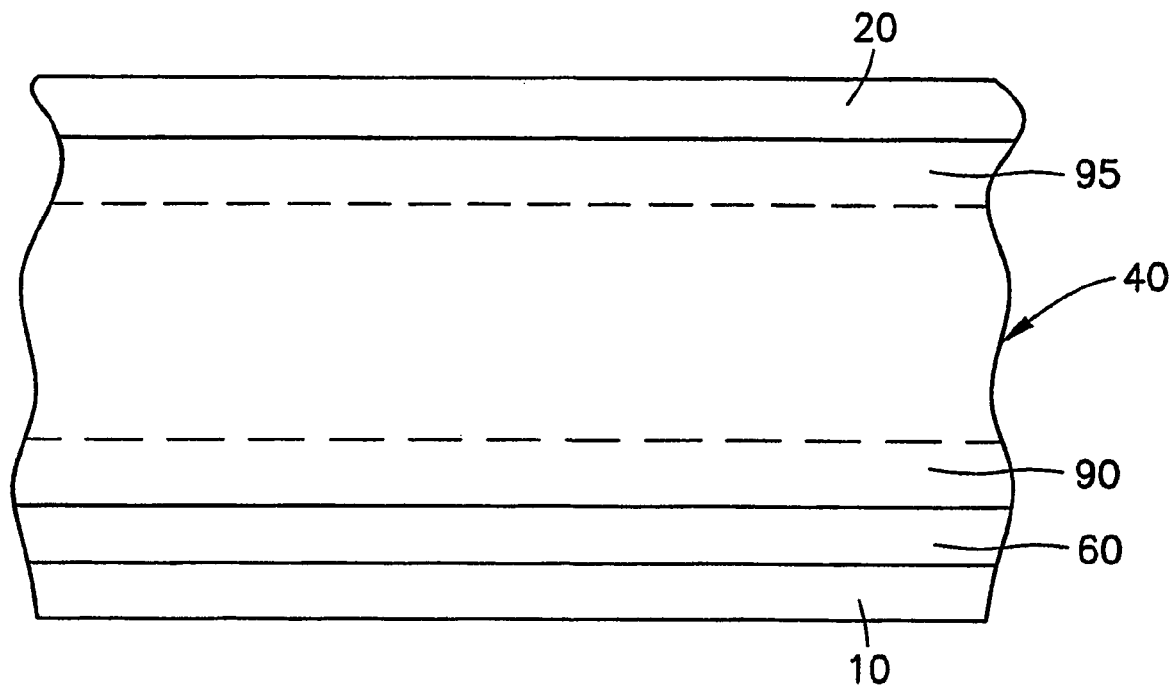
FIG. 2 shows a schematic cross section of a second embodiment of an OLED structure according to the present invention, where the host material forms the electron injection layer.
Figure 5:
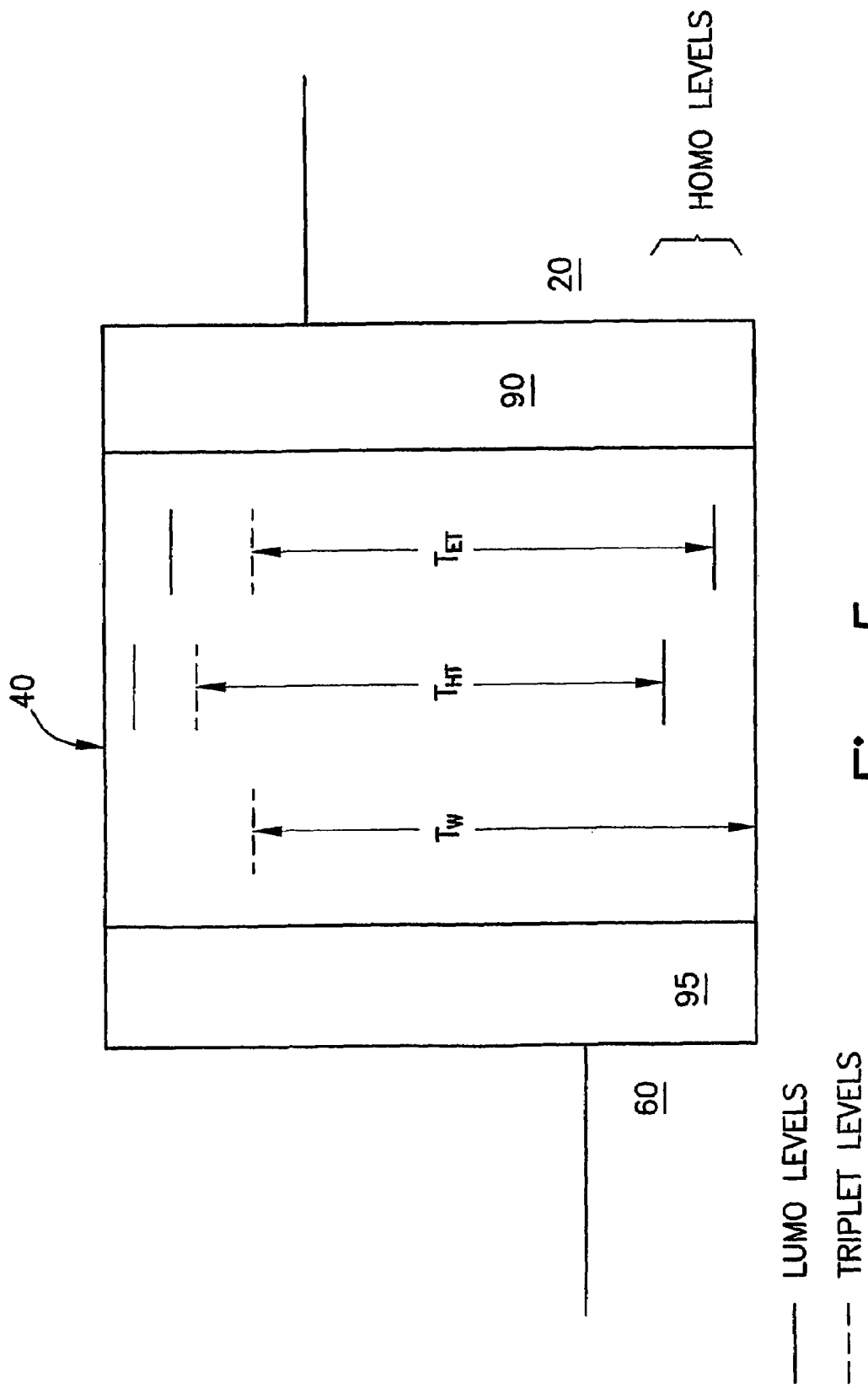
FIG. 5 is a diagram showing the energy levels in another OLED structure according to the invention.

In a different embodiment shown in FIG. 2, the OLED structure according to the invention includes electron and hole injection regions that are formed from portions of the inert host material, rather than being separate layers of different materials. Region 90 is an electron injection contact formed by an un-doped portion of the wide gap material layer 40. Region 95 is a hole injection contact also formed by an un-doped portion of wide gap material layer 40. These structures are used to prevent charge carriers or excitons from leaking out of the active region of the device, and from being quenched at the interfaces between the electrodes and the organic material layers. FIG. 5 shows the energy levels associated with this embodiment.

The optional non-doped regions 90, 95 can be layers that are sufficiently thick to function as hole and/or exciton blocking layers, if necessary, but are also sufficiently thin to permit effective injection of electrons.

Figure 3:
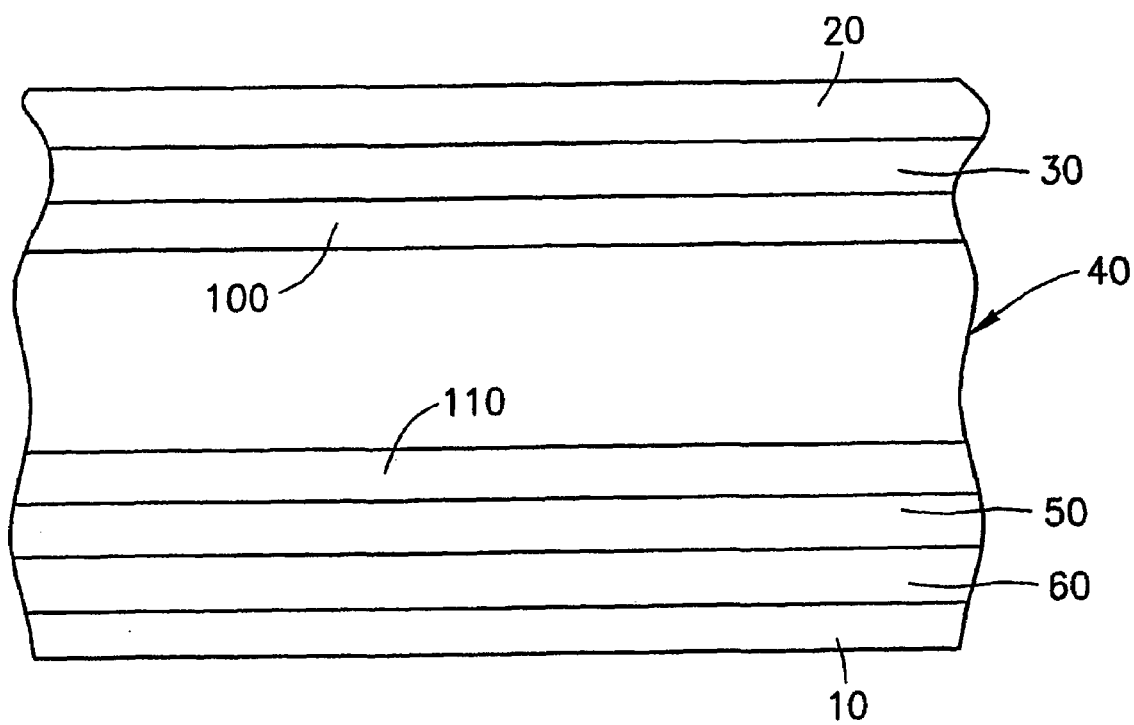
FIG. 3 shows a schematic cross section of a third embodiment of an OLED structure according to the present invention, including blocking layers.

In another embodiment of the OLED according to the invention, separate blocking layers are used between the emissive layer and the electrodes, wherein the blocking layers comprise a charge carrying material rather than an inert, non-charge-carrying material. As shown in FIG. 3, first and second blocking layers 100, 110 are formed adjacent to the wide gap host material layer 40, between the doped layer and the electrodes. The materials forming these layers are selected to confine carrier recombination and emission to the doped layer of the wide gap host material layer 40. Blocking layers 100,110 can be used, for example, when un-doped regions of wide gap host material layer 40, such as injection regions 90,95 shown in FIG. 2, do not provide sufficient confinement and carrier injection. In some cases, only one blocking layer may be used, for example, a hole and/or exciton blocking layer between the emission layer and the cathode layer.

Figure 4:
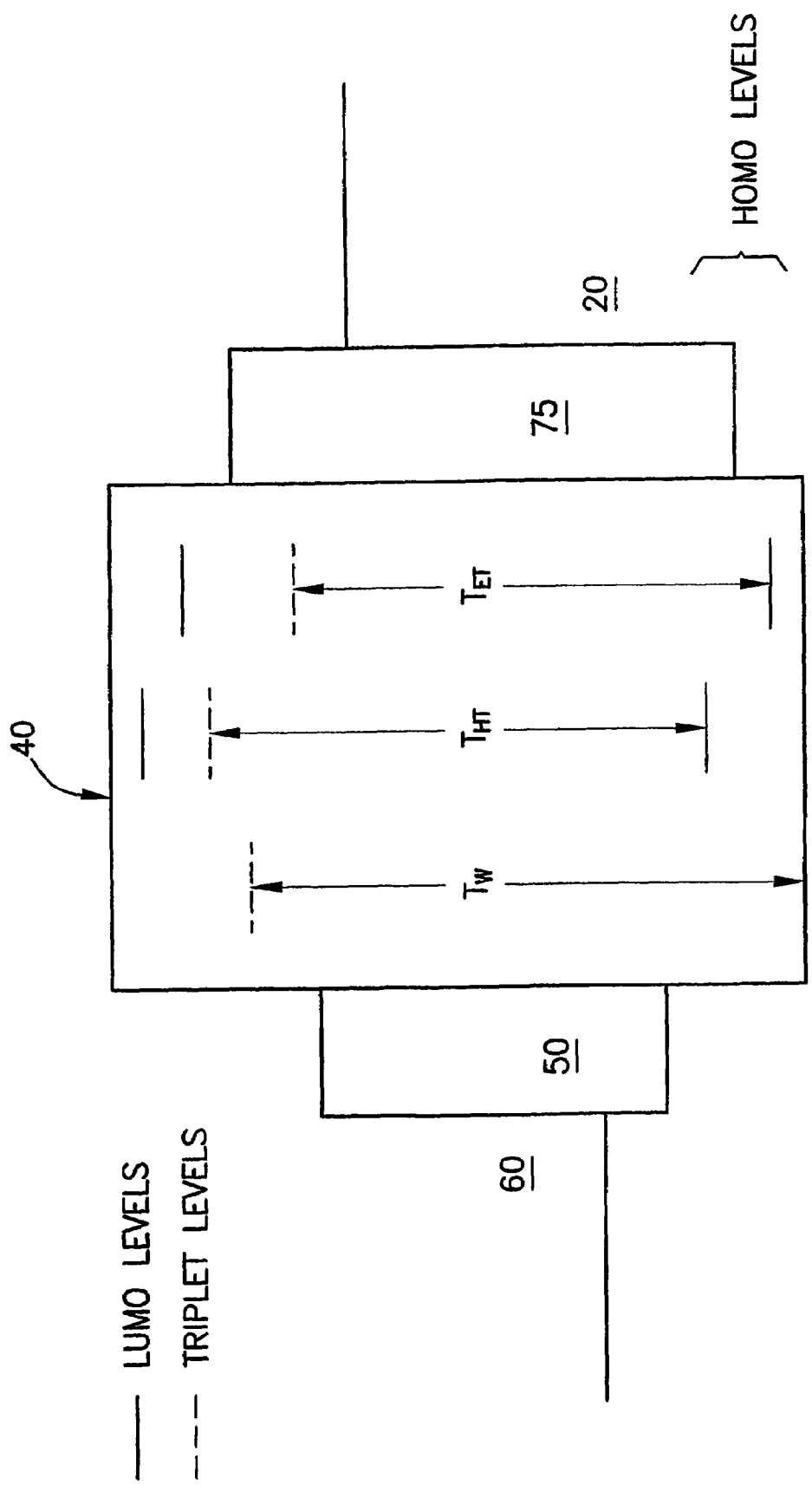
FIG. 4 is a diagram showing the energy levels in an OLED structure according to the invention.

FIG. 4 shows the energy levels of the materials forming an OLED device according to the invention, and including an electron injection layer 75 and a hole injection layer 50. In the case where the phosphorescent dopant material dispersed in the wide gap host material layer 40 is an electron transporter, then $T_{HT}>T_{ET}$, and $T_W>T_{ET}$, where T indicates triplet energy, and the subscripts indicate the wide gap material (W), the electron transporter (ET) and hole transporter (HT). In the case where the phosphorescent dopant material is a hole transporter, then $T_{ET}>T_{HT}$ and $T_W>T_{HT}$.

From these relations it follows that the triplet state energy level of the host material layer 40 is greater than the triplet state energy level of the emitter dopant, but does not have to be greater than that of the non-emitting dopant. The HOMO-LUMO energy gap of the inert host material layer 40, in contrast to the triplet level, is greater than the energy gap of both the hole and electron transporters. Preferably, the HOMO level of the inert host material is lower than the HOMO level of any of the dopant materials as well as any adjacent layers that are in direct physical contact with the inert host material. In addition, the LUMO level of the inert host material Is higher than the LUMO level of any of the dopant materials as well as any adjacent layers that are in direct physical contact with the inert host material. As would be understood by one skilled in the art, a material that has a lower HOMO level as compared with another material is one that has a higher ionization potential (IP) as compared with the IP of the other material. Similarly, also as would be understood by one skilled in the art, a material that has a higher LUMO level as compared with another material is one that has a lower electron affinity as compared with the electron affinity of the other material.

When the above requirements and preferences are applied to the materials used according to the invention, the constraints on the HOMO and LUMO levels of the inert host material layer 40 relative to the levels of the electron and hole transporter dopants typically result in an inert host material layer having a wide energy gap between the HOMO and the LUMO energy levels. To ensure that the host material layer 40 is inert, the host material may be selected to have an energy gap of at least about 3.5 eV, and a triplet energy level well above the energy levels of both dopant materials forming the phosphorescent doped layer. This is especially important when the phosphorescent doped layer includes phosphors that emit blue light.

It is to be understood that while this 3.5 eV energy requirement may be used for convenience in selecting host materials that hold the greatest promise of functioning as effective inert hosts, there may be certain combinations of OLED materials that permit use of a host material with a slightly smaller energy gap and yet still provide highly efficient blue phosphorescence, provided that the other constraints as described herein are met. Thus, while the term "wide gap" material may typically refer to materials having a HOMO-LUMO energy gap of at least 3.5 eV, the term "wide gap" material, as used herein, may refer to any material that has a HOMO-LUMO energy gap large enough that it does not function as a charge carrying material when used as a host matrix in an OLED. Since a so-called non-charge-carrying material may be able to carry charge at least to some small degree, a non-charge-carrying material may be characterized herein as one which carries at least ten times less current than either of the charge carrying dopants.

According to the invention, the wide gap host material layer 40 is doped with two different materials, a charge carrying dopant material and a charge carrying phosphorescent dopant material, that are dispersed within the host material to form the emissive layer. The two dopant materials are typically dispersed uniformly throughout the host matrix, with the concentrations of each being independently selected to produce the desired results.

The charge carrying dopant material can be, for example, a hole transporting material, in which case the phosphorescent dopant material is also capable of transporting electrons. In an alternate embodiment, the roles are reversed, and the charge carrying dopant material transports electrons while the phosphorescent dopant material transports holes.

In one embodiment, the wide gap host material layer 40 can be formed, for example, by di-phenylenes, tri-phenylenes, napthalenes, tetraphenylbutadienes, which may, in each case, be substituted or unsubstituted, and other organic and metal organic materials. In another exemplary embodiment in which the phosphorescent dopant material is a hole transporter, the charge carrying dopant material can include electron transporting materials such as oxidiazoles, traizoles, cyclooctatetraenes and other wide gap electron transporters. When the electron transporting is carried out by the phosphorescent dopant material, the charge carrying dopant material can include hole transporting materials such as triarylamines, metal coordination complexes, donor substituted napthalenes and other wide gap materials with suitably high energy HOMO levels.

The charge carrying dopant material must have triplet energy levels above those of the phosphorescent dopant material. This is in addition to the requirement described above that the wide gap host material layer 40 must also have triplet energy levels above those of the phosphorescent dopant material. The same materials that are used as the charge carrying dopant material can also be used as the hole and/or exciton blocking layers that may be included in the structure of the OLED.

In general, these materials must have triplet energy levels corresponding to the UV-blue region of the visible spectrum so as to result in OLEDs that produce blue emission from the lower triplet state levels of the phosphorescent dopant.

The phosphorescent dopant material has a dual function of providing a phosphor that emits electromagnetic radiation in the desired wavelength range, and also providing a charge transporting material. As described above, when the charge carrying dopant material is an electron transporter, the phosphorescent dopant material must be a hole transporter, and vice versa.

For example, the phosphorescent dopant material can contain a heavy metal atom, and can have a structure as shown below.

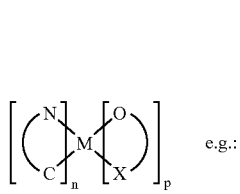
e.g.:
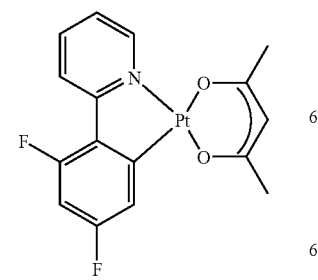

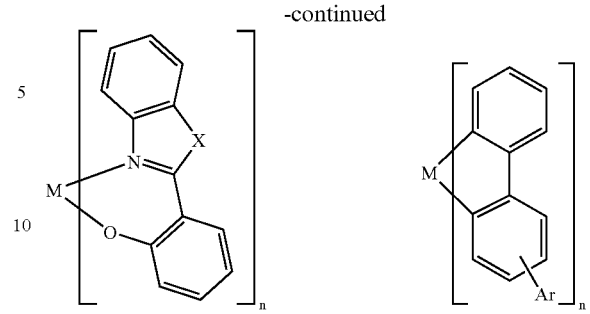

In the diagram, M represents a heavy transition metal, C—N a cyclometallated ligand and O—X a coordination ligand wherein X can be O, N or S, and wherein n=1 or 2, and p=0 or 1. These materials may be selected to form the doping phosphors because of their ability to tune the energies of the metal to ligand charge transfer and of the intraligand ($3\pi$-$\pi$*) excited states. In one example, the heavy metals forming the described compounds are preferably Ir or Pt atoms.

EXAMPLE OF THE INVENTION

Using materials and methods known in the art for fabricating OLED's, in one exemplary embodiment, an OLED according to the invention was produced using a film of polystyrene as the inert host material. The dopant layers were formed by doping the inert host material with 15% of a hole transporting phosphorescent dopant and 40% of an electron transporting oxidiazole. More specifically, the phosphorescent dopants were bis(phenylpyridine) iridium acetylacetonate (PPIr), having the chemical structure:

and bis(2-phenylbenzothiazole) iridium acetylacetonate (BTIr), having the chemical structure:

and the oxidiazole was (4-biphenyl)(4-tertbutylphenyl)oxidiazole (PDB), having the chemical structure:

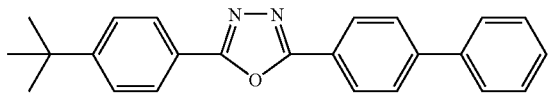 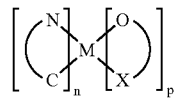

The device emitted light solely from the dopant with turn-on voltages of between about 7 and 9 Volts. The polystyrene acted as an inert matrix in which the dopants were supported. Although this device produced light in the green region of the visible spectrum, a different phosphor dopant in the same configuration may be used to produce light in the blue region of the spectrum.

It should be noted that additional layers can be used in the construction of OLEDs according to the present invention. These additional layers are known in the art, and thus will not be discussed in detail.

It will be apparent to those skilled in the art that various modifications and variations can be made in the structure and methodology of the present invention, without departing from the spirit or scope of the invention. Thus, it is intended that the present invention covers the modifications and variations of this invention provided they come within the scope of the appended claims and their equivalents.

We claim:

1. An organic light emitting device comprising:
   an anode layer;
   an emissive layer over the anode layer, the emissive layer comprising a host material, a hole transporting dopant material, and a phosphorescent dopant material; and
   a cathode layer over the emissive layer;
   wherein the HOMO level of the host material is lower than the HOMO level of the hole transporting dopant material and the LUMO level of the host material is higher than the LUMO level of the phosphorescent dopant material.

2. The device of claim 1, wherein the lowest triplet state energy level of the host material and the lowest triplet state energy level of the hole transporting carrying dopant material are each higher than the lowest triplet state energy level of the phosphorescent dopant material.

3. The device of claim 2, wherein the lowest triplet state energy level of the host material is higher than the lowest triplet state energy level of the hole transporting dopant material.

4. The device of claim 3, wherein the host material has an energy gap between the HOMO and the LUMO energy levels of at least about 3.5 eV.

5. The device of claim 2, wherein the host material comprises a material selected from the group consisting of a di-phenylene, a substituted di-phenylene, a tri-phenylene, a substituted tri-phenylene, a napthalene, a substituted napthalene, a tetraphenylbutadiene, and a substituted tetraphenylbutadiene.

6. The device of claim 2, wherein the hole transporting dopant material comprises a material selected from the group consisting of a triarylamine, a metal coordination complex, and a donor substituted naphthalene.

7. The device of claim 2, wherein the phosphorescent dopant material comprises a compound having a structure of general formula:

wherein M is a heavy transition metal; C—N is a cyclometallated ligand; O—X is a coordination ligand wherein X is selected from the group consisting of oxygen, nitrogen, and sulfur; and wherein n equals 1 or 2, and p equals 0 or 1.

8. The device of claim 7, wherein M is selected from the group consisting of iridium, platinum, osmium, and gold.

9. The device of claim 1, wherein the host material has an energy gap between the HOMO and the LUMO energy levels of at least about 3.5 eV.

10. The device of claim 1, wherein the emissive layer emits radiation in the blue region of the visible spectrum.

11. The device of claim 10, wherein the radiation has an emission peak in the range of from about 430 nm to about 470 nm.

12. The device of claim 11, wherein the emission peak is at about 450 nm.

13. The device of claim 1, further comprising a hole injecting layer between the anode layer and the emissive layer.

14. The device of claim 13, further comprising an electron injecting layer between the emissive layer and the cathode layer.

15. The device of claim 14, further comprising a hole blocking layer between the emissive layer and the electron injecting layer.

16. The device of claim 15, further comprising an electron blocking layer between the emissive layer and the hole injecting layer.

17. The device of claim 15, further comprising an exciton blocking layer between the emissive layer and the hole injecting layer.

18. The device of claim 14, further comprising an exciton blocking layer between the emissive layer and the electron injecting layer.

19. The device of claim 1, further comprising an electron injecting layer between the emissive layer and the cathode layer.

20. The device of claim 1, wherein the host material includes an electron injection region comprising an un-doped region of the host material which is in contact with the anode layer, and a hole injection region comprising an un-doped region of the host material which is in contact with the cathode layer.

21. An organic light emitting device comprising:
    an anode layer;
    an emissive layer over the anode layer, the emissive layer comprising a host material, an electron transporting dopant material, and a phosphorescent dopant material; and
    a cathode layer over the emissive layer;
    wherein the HOMO level of the host material is lower than the HOMO level of the phosphorescent dopant material and the LUMO level of the host material is higher than the LUMO level of the electron transporting dopant material.

22. The device of claim 21, wherein the lowest triplet state energy level of the host material and the lowest triplet state energy level of the electron transporting dopant material are each higher than the lowest triplet state energy level of the phosphorescent dopant material.

23. The device of claim 22, wherein the lowest triplet state energy level of the host material is higher than the lowest triplet state energy level of the electron transporting dopant material.

24. The device of claim 23, wherein the host material has an energy gap between the HOMO and the LUMO energy levels of at least about 3.5 eV.

25. The device of claim 22, wherein the host material comprises a material selected from the group consisting of a di-phenylene, a substituted di-phenylene, a tri-phenylene, a substituted tri-phenylene, a napthalene, a substituted napthalene, a tetraphenylbutadiene, and a substituted tetraphenylbutadiene.

26. The device of claim 22, wherein the electron transporting dopant material comprises a material selected from the group consisting of an oxidiazole, a traizole, and a cyclooctatetraene.

27. The device of claim 22, wherein the phosphorescent dopant material comprises a compound having a structure of general formula:

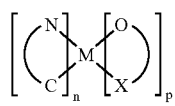

wherein M is a heavy transition metal; C—N is a cyclo-metallated ligand; O—X is a coordination ligand wherein X is selected from the group consisting of oxygen, nitrogen, and sulfur; and wherein n equals 1 or 2, and p equals 0 or 1.

28. The device of claim 27, wherein M is selected from the group consisting of iridium, platinum, osmium, and gold.

29. The device of claim 22, wherein the host material comprises polystyrene, the electron transporting dopant material comprises (4-biphenyl)(4-tertbutylphenyl)oxidiazole (PDB), having the chemical structure

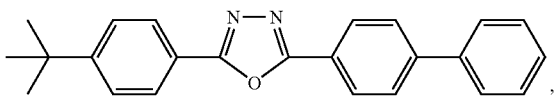

and the phosphorescent dopant material comprises bis (phenylpyridine) iridium acetylacetonate (PPIr), having the chemical structure

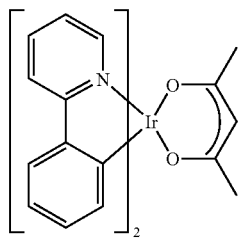

and bis(2-phenylbenzothiazole) iridium acetylacetonate (BTIr), having the chemical structure

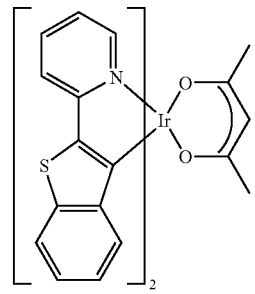

30. The device of claim 21, wherein the host material has an energy gap between the HOMO and the LUMO energy levels of at least about 3.5 eV.

31. The device of claim 21, wherein the emissive layer emits radiation in the blue region of the visible spectrum.

32. The device of claim 31, wherein the radiation has an emission peak in the range of from about 430 nm to about 470 nm.

33. The device of claim 32, wherein the emission peak is at about 450 nm.

34. The device of claim 21, further comprising a hole injecting layer between the anode layer and the emissive layer.

35. The device of claim 34, further comprising an electron injecting layer between the emissive layer and the cathode layer.

36. The device of claim 35, further comprising a hole blocking layer between the emissive layer and the electron injecting layer.

37. The device of claim 36, further comprising an electron blocking layer between the emissive layer and the hole injecting layer.

38. The device of claim 36, further comprising an exciton blocking layer between the emissive layer and the hole injecting layer.

39. The device of claim 35, further comprising an exciton blocking layer between the emissive layer and the electron injecting layer.

40. The device of claim 21, further comprising an electron injecting layer between the emissive layer and the cathode layer.

41. The device of claim 21, wherein the host material includes an electron injection region comprising an un-doped region of the host material which is in contact with the anode layer, and a hole injection region comprising an un-doped region of the host material which is in contact with the cathode layer.

* * * * *